United States Patent [19]

Sugai

[11] Patent Number: 5,281,882
[45] Date of Patent: Jan. 25, 1994

[54] SURFACE ACOUSTIC WAVE ELEMENT
[75] Inventor: Kazuyoshi Sugai, Tokyo, Japan
[73] Assignee: Clarion Co., Ltd., Tokyo, Japan
[21] Appl. No.: 878,561
[22] Filed: May 5, 1992
[30] Foreign Application Priority Data
May 20, 1991 [JP] Japan .................. 3-143899
[51] Int. Cl.$^5$ .............................. H01L 41/08
[52] U.S. Cl. ..................... 310/313 A; 310/313 D; 364/821
[58] Field of Search ........... 310/313 R, 313 A, 313 B, 310/313 D; 333/150-155, 190-194; 364/819, 821, 825, 604

[56] References Cited

U.S. PATENT DOCUMENTS

| | | | |
|---|---|---|---|
| 4,449,107 | 5/1984 | Asai et al. | 310/313 A |
| 4,516,049 | 5/1985 | Mikoshiba et al. | 310/313 A |
| 4,539,501 | 9/1985 | Trong et al. | 310/313 A |
| 4,567,393 | 1/1986 | Asai et al. | 310/313 A |
| 4,571,519 | 2/1986 | Kawabata et al. | 310/313 A |
| 4,752,709 | 6/1988 | Fujishima et al. | 310/313 A |
| 4,757,226 | 7/1988 | Mitsutsuka et al. | 310/313 A |
| 4,884,001 | 11/1989 | Sacks et al. | 310/313 A |
| 4,943,751 | 7/1990 | Mitsutsuka | 310/313 A |
| 5,091,669 | 2/1992 | Mitsutsuka | 310/313 A |

OTHER PUBLICATIONS

New Modes in III-V monolithic SAW devices, by Henaff and Feldmann, 9th International Symposium on Gallium Arsenide and Related Compounds, OiSo Japan, Sep. 20-23, 1981, Inst. Phys. Conf., Ser. No. 63, Chapt. 9, pp. 455-460.
Integrated Circuit Compatible Surface Acoustic Wave Devices on Gallium Arsenide, Grudkowski et al., IEEE Transactions on Microwave Theory and Techniques, vol. MTT-29, No. 12, Dec. 1981.

Primary Examiner—Mark O. Budd
Attorney, Agent, or Firm—Flynn, Thiel, Boutell & Tanis

[57] ABSTRACT

A GaAs piezoelectric semiconductor thin film in the form of an epitaxial film is provided on a Si substrate 1, and an input transducer 3 and an output transducer 4 for input and output of a surface acoustic wave are provided on the film. A surface acoustic wave element, thus arranged, has a sound characteristic superior to that of a single crystalline GaAs substrate and permits the use of an electromechanical coupling coefficient larger than that of the single crystalline GaAs. Thus the element copes with a much higher sound velocity of SAWs.

20 Claims, 4 Drawing Sheets

8: $Al_xGa_{1-x}As$

8: $Al_xGa_{1-x}As$

SURFACE ACOUSTIC WAVE ELEMENT

BACKGROUND OF THE INVENTION

1. Field of the Invention

This invention relates to a surface acoustic wave element and, in particular, to an improvement of a monolithic surface acoustic wave element made of a piezoelectric layer and a semiconductor.

2. Description of the Prior Art

A surface acoustic wave (SAW) element has an important role as a signal processing device because of its high frequency signal storage function and batch processing function. Moreover, when a monolithic integrated device is made by incorporating the surface acoustic wave element and a semiconductor device on a single substrate has additional various functions, such as amplification, multiplication and so forth, which are realized by the semiconductor element, it is becoming multifunctional.

There are two current proposals for arrangement of monolithic multifunctional integrated SAW devices. One of them is a multi-layered structure forming a piezoelectric thin film of ZnO, AlN, etc. on a Si semiconductor substrate, and the other is a structure incorporating an SAW device and a semiconductor device on a GaAs substrate which is a piezoelectric semiconductor.

A III-V group compound semiconductor such as GaAs has the following electric, acoustic and optical properties as compared to Si:

a) Electron mobility is as high as several times the value of Si.
b) Electric conductivity can be controlled over a wide range from a semi-insulator to a conductor.
c) It has a piezoelectricity.
d) An element which can emit or receive wide range of light from visible rays to infrared rays.

In addition, because of recent remarkable development of technology for making a III-V group compound semiconductor thin film, it has been possible to form a GaAs/AlGaAs or other element having a hetero structure, and a device utilizing quantum effects is also appreciated to have excellent functions.

As discussed above, GaAs has many functions that Si does not; however, the multifunctional property of an element has come to a limit in the existing composite devices of Si and a piezoelectric thin film such as ZnO, AlN, etc.

Problems with an SAW device using GaAs is a high cost of its substrate caused by bad productivity because it is still difficult to produce wafer with a sufficiently large diameter.

OBJECT OF THE INVENTION

It is therefore a major object of the invention to provide a fundamental element structure that permits a monolithic integrated SAW device to have a multifunctional property of a high level and over a wide range.

SUMMARY OF THE INVENTION

A fundamental structure of a surface acoustic wave element according to the invention includes a Si substrate, a GaAs piezoelectric semiconductor film provided on the Si substrate, and a transducer provided on the GaAs piezoelectric semiconductor film to generate a surface acoustic wave.

This arrangement makes it possible to produce a large-diameter wafer while maintaining a low cost by using a large-diameter Si substrate and further adding functions of the GaAs semiconductor.

DETAILED DESCRIPTION OF THE PREFERRED EMBODIMENT

First Embodiment (GaAs/Si Surface Acoustic Wave Device)

GaAs is a piezoelectric semiconductor material, and a piezoelectric effect can be used practically on a semiconductor substrate or in a depletion region. The velocity and the electromechanical coupling coefficient of an SAW propagating in the <110> direction of the GaAs single crystalline (100) substrate are 2868 m/s and 0.72%, respectively.

Figure 1:
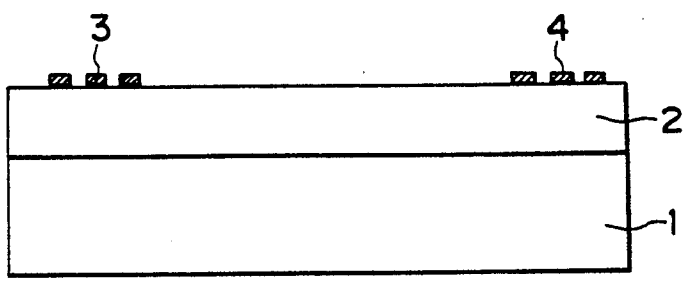
FIG. 1 is a side elevation of a surface acoustic wave element taken as an embodiment of the invention.

FIG. 1 shows a fundamental arrangement of the GAAs/Si SAW element. Reference numeral 1 denotes a Si (100) substrate on which a GaAs piezoelectric semiconductor thin film 2 is provided by a MO CVD method. The GaAs film is an epitaxial film whose (100) surface grows. On the GaAs piezoelectric semiconductor thin film 2 are provided transducers 3 and 4 for exciting and receiving an SAW. The propagating direction of the SAW is substantially parallel to Si<110> and GaAs<110> directions. Since a Si substrate having a slightly offset angle is used for epitaxial growth of the GaAs thin film in most cases, it means that the surface orientation and direction, indicated here, are nearest to it, and it may be considered to have a certain width. The GaAs piezoelectric semiconductor thin film 2 is no-doped GaAs, and its specific resistance is set high. Since the non-doped GaAs piezoelectric semiconductor thin film 2 has a sufficiently high specific resistance, it represents a sufficient piezoelectricity. In order to further elevate the specific resistance of the film, there are the following two methods:

1) After the GaAs piezoelectric semiconductor thin film is formed, it is changed to a semi-insulator by proton impulse.
2) The SAW transducers are formed as Schottky electrodes, and a DC bias is applied to extend a depletion layer under the electrodes.

Either of the methods permits the maximum use of the piezoelectricity of GaAs.

Figure 2:
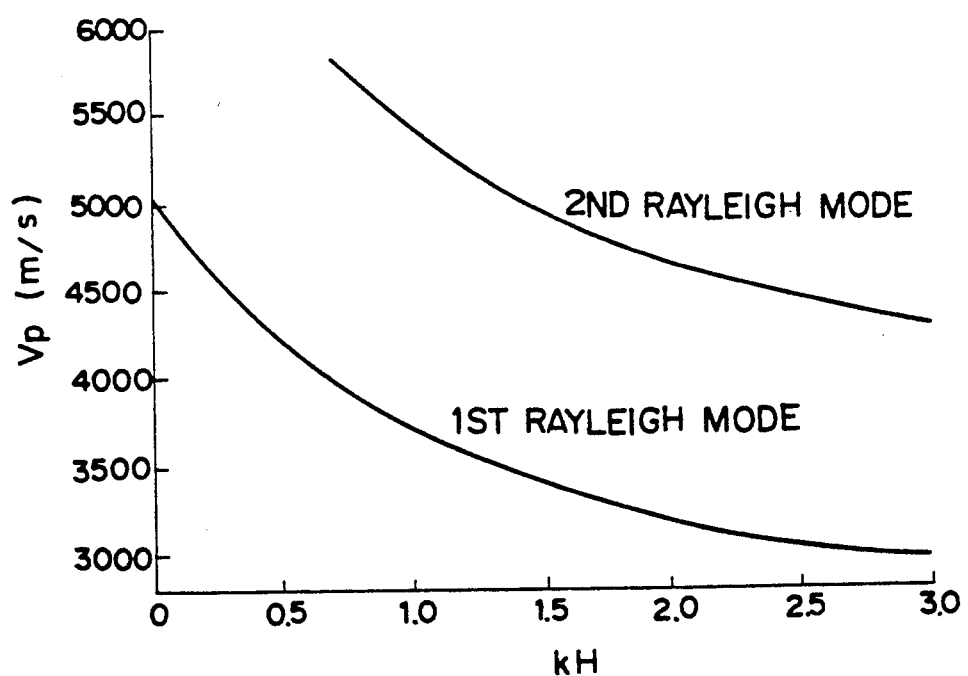
FIG. 2 is a graph showing the dependency of the phase velocity of an SAW on a GaAs thin film.

The graph of FIG. 2 shows the relationship between the phase velocity Vp of an SAW travelling in the GaAs/Si structure and the thickness H of the GaAs film. The letter k denotes the number of waves of the SAW ($k=2\pi/\lambda$, where $\lambda$ is the wave length of the SAW). The GaAs/Si multi-layered structure gives such effects that the speed is much faster than the sound velocity of the GaAs single crystal, the periodical length of the transducers may be large when realizing a high frequency SAW element, and photo lithographic processing is easy. Further, in the range of $kH \geq 0.7$, the second Ray mode exists, and the phase velocity thereof is larger.

Figure 3:
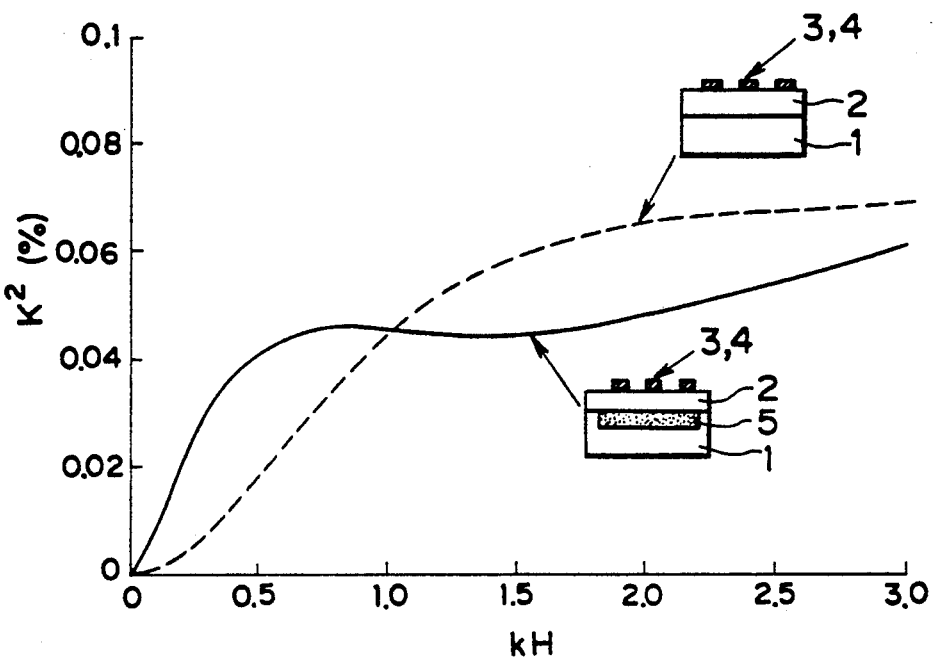
FIG. 3 is a graph showing the coupling coefficient of a first Rayleigh mode of a GaAs/Si structure.
Figure 4:
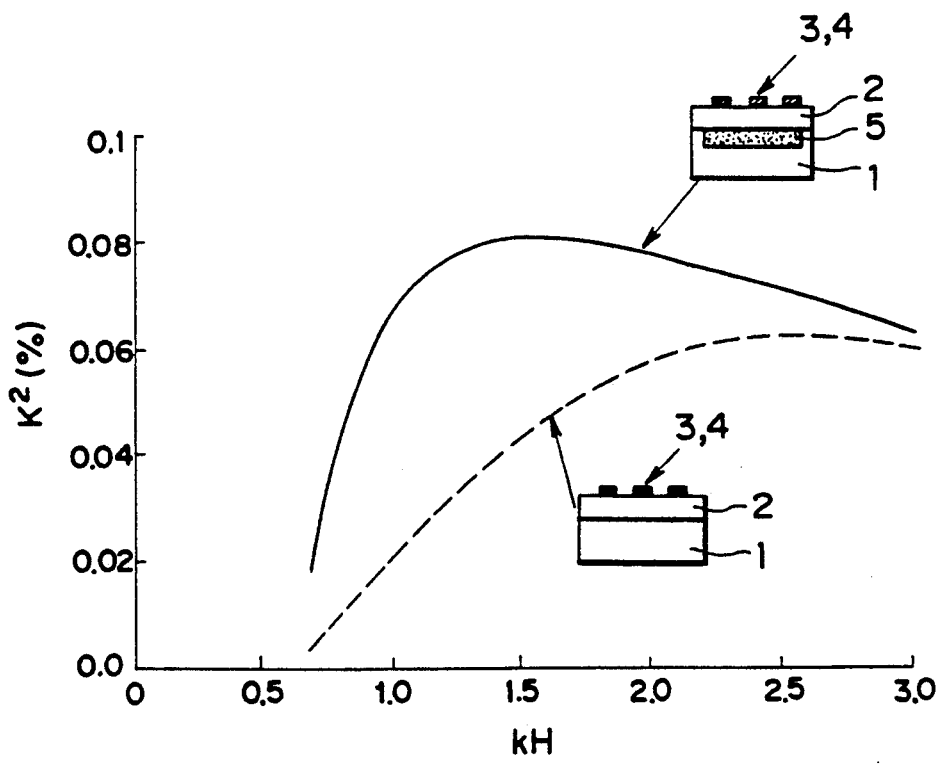
FIG. 4 is a graph showing the coupling coefficient of a second Rayleigh mode of a GaAs/Si structure.

The graphs of FIGS. 3 and 4 show the dependency on the GaAs film thickness of the electromechanical coupling coefficient of the SAW transducers formed on the GaAs/Si structure.

FIG. 3 shows the first Rayleigh mode, and FIG. 4 shows the second Rayleigh mode. Two kinds of arrangements of the SAW transducers are shown in each of the drawings. One of them is such that the specific resistance of the Si substrate 1 is relatively high and electrodes 3 and 4 are provided on the surface. In this arrangement, if the GaAs film thickness is relatively large, a large coupling coefficient is obtained. The other of them has electrodes 3 and 4 on the surface of GaAs and a highly concentrated impurity diffused region 5 is provided on the surface of the Si substrate 1 under the electrodes. The latter provides a large coupling coefficient in a region where the GaAs film thickness is relatively small, as compared to the former. A property to be particularly remarked is that the multi-layered structure in the latter transducer arrangement provides a coupling coefficient larger than that of the single crystalline GaAs substrate.

The latter transducer arrangement includes a highly concentrated impurity diffused region extending under the electrodes alone; however, the same coupling coefficient is obtained even by using a low resistant Si single crystalline substrate. However, since the GaAs/Si structure has a large characteristic that it permits incorporation of a semiconductor element in the Si or GaAs region, it is general that the specific resistance of the Si substrate is set to a value optimizing the characteristic of the semiconductor element to be incorporated, and a highly concentrated impurity diffused region is provided under the transducer electrodes.

The graphs of FIGS. 2, 3, and 4 provide the following information:

a) It is preferred to use the second Rayleigh mode in the SAW functional element having the GaAs/Si structure.
b) The thickness H of the GaAs film is preferably set to $kH \geq 0.8$ in the second Rayleigh mode.
c) The phase velocity is significantly larger than that of the single crystalline GaAs substrate, and it is easier to make a device adaptive to high frequencies.
d) The coupling coefficient can be made larger than that of the single crystalline GaAs substrate.

As discussed above, the sound characteristic of the GaAs/Si structure can further improve the characteristic of the single crystalline GaAs substrate.

Second Embodiment (ZnO/GaAs/Si surface acoustic wave device)

The GaAs/Si structure according to the first embodiment represents a sound characteristic exceeding the characteristic of the single crystalline GaAs substrate. The coupling coefficient, however, is as small as on the order of 0.08%, and the use thereof to functional devices may be limited. The second embodiment is an improvement of the first embodiment in respect of the coupling coefficient.

Figure 5:
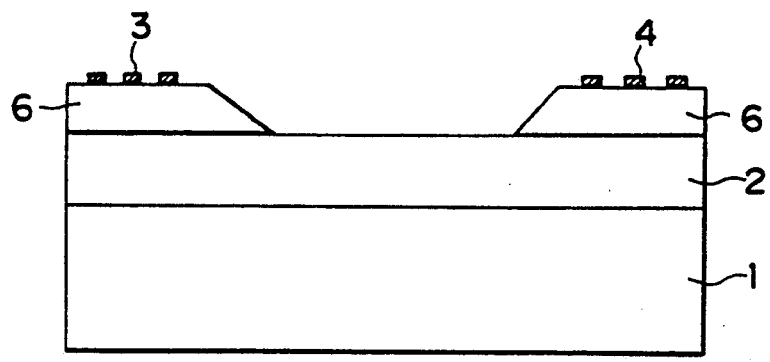
FIG. 5 is a side elevation of a surface acoustic wave element taken as a further embodiment of the invention.

FIG. 5 shows an arrangement therefor. In this embodiment, a ZnO piezoelectric film 6 is further provided on the GaAs/Si structure of the first embodiment, and SAW transducers 3 and 4 for exciting and receiving an SAW are provided on the surface of the ZnO piezoelectric film 6.

First and second Rayleigh modes exist also in this arrangement as in the first embodiment, and a large coupling coefficient as that of the ZnO/Si structure is obtained. Note here that the ZnO piezoelectric thin film 6 is formed only in portions corresponding to the SAW transducers.

Figure 6:
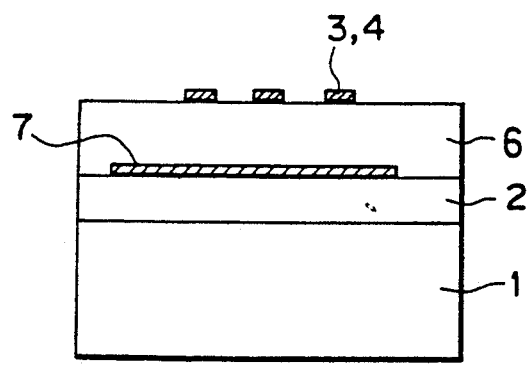
FIG. 6 is a side elevation of a surface acoustic wave element taken as a still further embodiment of the invention.
Figure 7:
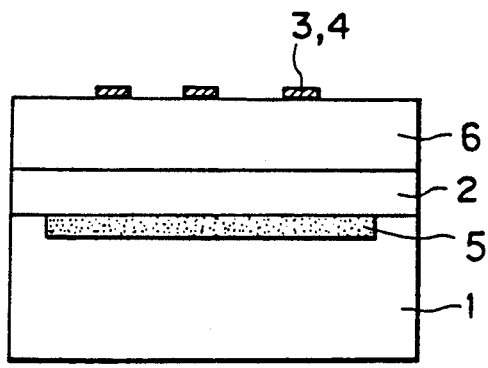
FIG. 7 is a side elevation of a surface acoustic wave element taken as a yet further embodiment of the invention.

Various transducer arrangements are acceptable. FIGS. 6 and 7 show examples that are particularly effective in exciting and receiving efficient. The arrangement of FIG. 6 includes a metal electrode 7 provided in the boundary between the ZnO film 6 and the GaAs film 2. The arrangement of FIG. 7 includes a highly concentrated impurity diffused region 5 provided on the surface of the Si substrate 1. In either of the arrangements, comb-shaped input and output transducer electrodes 3 and 4 are provided on the surface of the ZnO piezoelectric film. The metal electrode 7 and the highly concentrated impurity diffused region 5 are normally formed only under the transducers. The transducer arrangement shown in FIGS. 6 and 7 provide a large electromechanical coupling coefficient particularly in the second Rayleigh mode.

Third Embodiment (GaAs/Si ACT element)

Recently, attention is paid to an acoustic charge transfer (ACT) element which is a high-speed signal processing device similar to GaAs CCD. A CW-excited SAW becomes a clock signal and confines electric charges in a potential well of the SAW to transfer the charges in synchronization with the SAW velocity. This arrangement does not require a clock gate electrode such as GaAs CCD, and provides a charge transfer element having a very high speed. The charges, transferred, are detected successively by a non-destructive sensing tap provided on a channel, and weighted by a gain control dual gate FET or the like. The sum thereof is output. Delay and product-sum operation are tried in a high speed, and an ideal transversal filter function is realized by the ACT element. The band in which the element can processes a signal is restricted by SAW frequency/2 (Nyquist frequency) regardless of the frequency characteristic of the SAW transducer, and the band is significantly large. Delay is determined by the SAW velocity and the length of the device, and a relatively large delay amount is realized. Therefore, the time zone product which indicates the possibility of processing by the signal processing element. The following documents refer to operations of ACT:

a) M. J. Hoskins, et al., "Charge transport by surface acoustic waves in GaAs", Appl. Phys. Lett., 41(4), pp. 332-223, 1982.
b) W. J. Tanski, et al., "Heterojunction acoustic charge transport devices on GaAs", Appln. Phys. Lett., 52(1), pp. 18-20, 1988.

Figure 8:
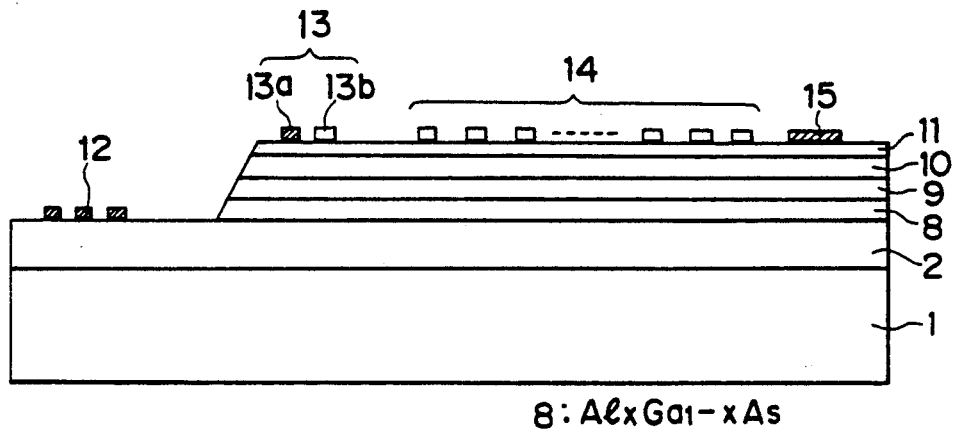
FIG. 8 is a side elevation of a surface acoustic wave element taken a yet still further embodiment of the invention.

FIG. 8 shows an embodiment of the ACT element based on GaAs/Si. Its arrangement and the principle of its operation are explained below with reference to FIG. 8.

A GaAs piezoelectric semiconductor thin film 2 is formed on a Si (100) substrate 1. The GaAs piezoelectric semiconductor thin film 2 is non-doped GaAs, but it is changed to a semi-insulator by proton impulse to the GaAs layer 2 in order to utilize its piezoelectricity to the maximum. Thereafter, a non-doped $Al_xBa_{1-x}As$ layer 8 is formed. Further, a non-doped GaAs transfer channel layer 9 is formed. Next, an n type $Al_xGa_{1-x}As$ charge supply layer 10 is formed. By setting the Al mole ratio of $Al_xGa_{1-x}$ liquid crystal to 0.3, the energy gap of the conduction band is 0.25 eV in the boundary between GaAs and $Al_xGa_{1-x}As$, and an energy gap is produced in the form of a band. That is, the multi-layered structure of $Al_xGa_{1-x}As/GaAs/Al_xGa_{1-x}As$ forms double junctions. Charges to be transferred are electrons, and the electrons are confined in the non-doped GaAs transfer channel layer 9. In the structure of FIG. 8, a non-doped cap layer 11 is further provided. The film thickness of the double hetero junction layers 8 to 11 formed on the GaAs piezoelectric semiconductor film 2 may be significantly small, 2000 to 3000 Å in total. In particular, the non-doped GaAs transfer channel layer 9 is formed in a location distant from the surface of the element by as small as 1000 Å, that is, quite near to the surface. Part of the double hetero junction layers 8 to 11 in the location for the SAW transducer except the transfer channel region is removed by mesa etching.

Reference numeral 12 denotes the unidirectional transducer for CW excitation, which is provided in the location from which the double hetero junction layers 8 to 11 have been removed. The transducer 12 normally includes a comb-shaped electrode in the form of a Schottky electrode and a SAW grating reflector provided in a location opposite to the SAW propagating direction. Reference numeral 13 denotes an input diode for inputting a signal, and it includes an ohmic electrode 13a and a Schottky electrode 13b. An electron is injected by the input diode. Reference numeral 14 denotes a non-destructive sensing tap Schottky electrode formed on the transfer channel for detecting packets of electrons to be transferred in the channel in a non-destructed form. Reference numeral 15 denotes an ohmic electrode for extracting electrons transferred.

Figure 9:
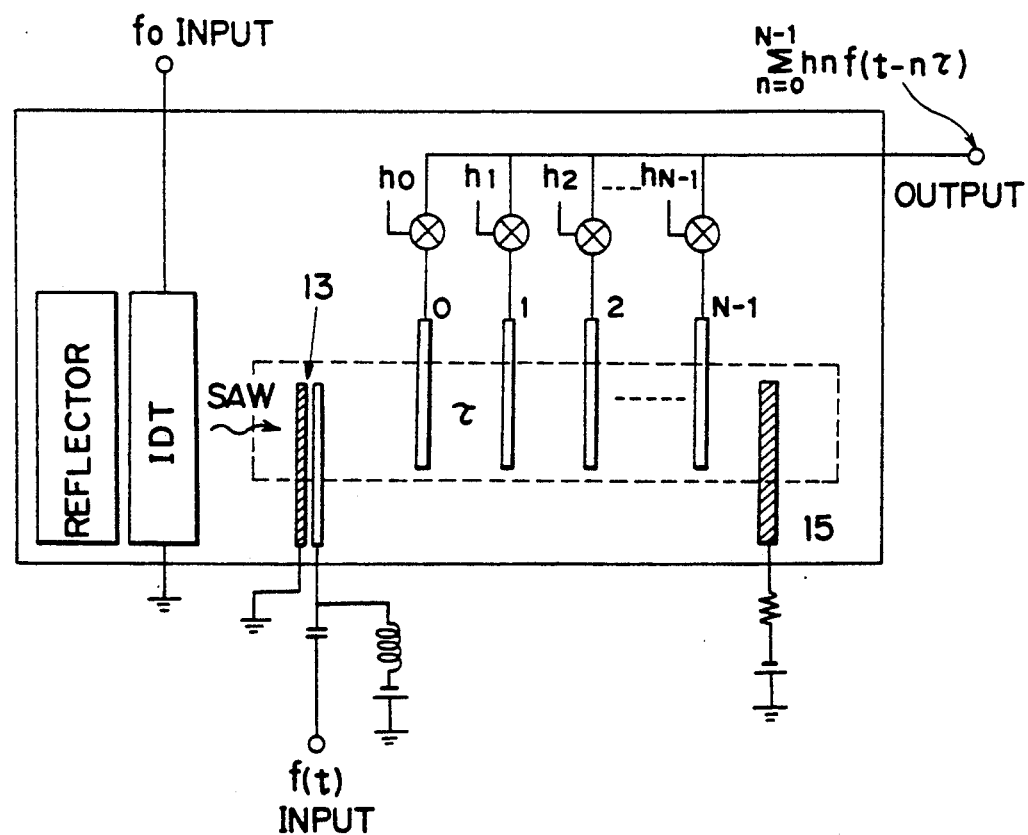
FIG. 9 is a plan view of the surface acoustic wave element.

Operations of an actual element are explained below with reference to FIG. 9 which is a plan view of the element. In order to excite a CW SAW to behave as a clock signal, a CW signal having a clock frequency $f_0$ is input to the unidirectional transducer 12 made of the comb-shaped electrode and the reflector and excites the a CW SAW travelling in the right direction in FIG. 9. A signal to be processed is input to the input 13. The input diode is made of the ohmic electrode and the Schottky electrode, and the ohmic electrode is normally grounded so that a signal is input to the Schottky electrode. A suitable DC reverse bias is applied to the Schottky electrode in order to set a constant electron amount in a packet during no input signal, and an RF signal is added to this potential. The input diode has an arrangement of a lateral Schottky diode. The potential of the Schottky electrode determines the level of the depletion layer under the diode. when an SAW potential passes under the input diode, the amount of electrons pulled to the potential well depends from the input signal. In this manner, an electrical signal is converted into an amount of charges (amount of electrons). Since the SAW propagates continuously, conversion into charges is repeated every period of the SAW, and the input signal is automatically sampled to form a charge packet confined in the valley of the SAW potential. Since the SAW is CW, and the form of the potential is substantially a sine wave. Therefore, respective charge packets are separated for each period of the SAW potential, and confinement of electrons is effected in the SAW travelling direction.

The charge packet sampled by the input diode is transferred in the channel in synchronization with the speed of the SAW. Since the longitudinal direction of the channel represents a double hetero structure as shown in FIG. 8, electrons are transferred while confined in the potential well (GaAs transfer channel layer) formed by hetero junction. Charge confinement in the transversal direction is attained by changing the portion other than the channel region shown by a broken line in FIG. 9 into a semi-insulator by proton impulse, or by removing the double hetero layers other than the channel region by mesa etching. Since changes are confined in three directions in this manner, the charge transfer element of this structure provides a remarkably high charge transfer efficiency.

The charge packet transferred in the channel is detected in a non-destructive manner by the Schottky electrode. There are two detecting methods: voltage detection and current detection, which are discriminated by a load coupled to the Schottky electrode. The load is a capacitive load in voltage detection and a resistant load in current detection. In either of them, a signal corresponding to the amount of charges in the charge packet is obtained. The Schottky electrodes are provided in certain intervals. When denoting the inter-tap SAW delay time by $\tau$ and the input signal by f(t), the n−th tap output is (t−nτ) which is a sample value of the input signal having a delay time corresponding to the location of the tap.

An output from each tap is weighted, then synthesized into an output. The weighting is effected by multiplication of a stored weighting factor and the tap output, and realized by a dual gate GaAs FET.

An output diode is provided at a right end of the element, so that transferred electrons are extracted to the exterior from the output diode.

The fundamental structure of the element is made by providing the GaAs/AlGaAs hetero junction on the GaAs/Si structure and providing the SAW transducer, the input diode, the output diode, and the non-destructive sensing tap.

In order to improve the exciting efficiency of the transducer, a ZnO piezoelectric film may be provided only in the portion of the transducer also in this arrangement like the second embodiment. Then the transducer input power can be reduced, which results in low power consumption of the element.

Effects of the First Embodiment a) By selecting an optimum design of the GaAs/Si structure, a sound characteristic exceeding the characteristic of a single crystalline GaAs substrate can be obtained. In particular, by using the second Rayleigh mode existing in the GaAs/Si multi-layered structure, an electromechanical coupling coefficient larger than that of single crystalline GaAs can be used to use a further larger sound velocity of an SAW.

b) A semiconductor element may be made of Si or GaAs, and a monolithic multifunctional SAW device can be realized.

By making the semiconductor element of GaAs, a high speed active element utilizing a larger electron mobility than Si may be incorporated. Also, light emitting and detecting elements may be incorporated to realize an OE functional element. In addition, incorporation of a CMOS digital IC into a Si substrate for low power consumption is easy. Thus the element is remarkably improved in multifunctional characteristic.

c) By providing the GaAs film on a large-diameter Si substrate, an increase in diameter of GaAs is possible with a minimum increase of the cost.

Effects of the Second Embodiment

In addition to the same effects as those of the first embodiment, the following additional effects are expected:

a) By providing the ZnO piezoelectric thin film in the SAW transducer regions, the electromechanical coefficient is increased significantly. In particular, this effect is remarkable in the second Rayleigh mode.

Effects of the Third Embodiment

By using the basis of the GaAs/Si structure and providing the hetero structure on it, a sound charge transfer element, which is a high-speed signal processing device, can be realized. Effects obtained by using GaAs/Si as the basis structure are summarized below:

a) The use of the Si substrate decreases the cost.

b) An increase in diameter of the wafer is possible.

c) In particular, the use of the second Rayleigh mode makes it possible to use a coupling coefficient larger than single crystalline GaAs. In addition, by providing the ZnO piezoelectric film in the transducer portion, a further increased coupling coefficient may be used. This leads to a decrease in input power of SAW CW behaving as a clock signal, and attains a significant amount of power consumption. Further, since the same input power leads to an increase in SAW potential strength, the charge capacity is increased, which is expected to be an expansion of the dynamic range.

d) In case of a sound charge transfer element, the completeness of the element is increased by incorporating various functions of signal detection, product-sum operation, memory of a weighting factor and so forth on a single chip. By making the high-speed operator for product-sum operation, etc. by using the GaAs semiconductor element and by making the memory and the logical circuit in the form of a Si-CMOS logic, a high-speed, low-consumptive integrated element is realized.

What is claimed is:

1. In a surface acoustic wave element which includes: a Si substrate; a GaAs piezoelectric semiconductor film provided on said Si substrate; and transducers provided on said GaAs piezoelectric semiconductor film to generate a surface acoustic wave; the improvement comprising wherein said GaAs piezoelectric semiconductor film has a thickness H which satisfies kH≧0.8, where said surface acoustic wave is a Sezawa wave having a wavelength λ, and k=2π/λ.

2. A surface acoustic wave element according to claim 1 further including a highly concentrated impurity diffused region in a surface of said Si substrate under said transducers.

3. A surface acoustic wave element according to claim 1 wherein said Si substrate is a low resistant single crystalline substrate.

4. A surface acoustic wave element according to claim 1 wherein said Si substrate has a cut surface equivalent to (100), and said GaAs film is an epitaxial film grown on said surface equivalent to (100).

5. A surface acoustic wave element according to claim 4 wherein said surface acoustic wave propagates in a direction substantially in parallel to the Si<110> and GaAs<110> direction.

6. A surface acoustic element according to claim 1, wherein said transducers are Schottky electrodes.

7. A surface acoustic wave element comprising: a Si substrate; a GaAs piezoelectric semiconductor film provided on said Si substrate; a ZnO film provided on said GaAs piezoelectric semiconductor film; and transducers provided on said ZnO film to generate a surface acoustic wave; wherein said GaAs piezoelectric semiconductor film has a thickness H which satisfies kH≧0.8, where said surface acoustic wave is a Sezawa wave having a wavelength λ, and k=2π/λ.

8. A surface acoustic wave element according to claim 7 further including a metal film provided in the boundary between said ZnO film and said GaAs film in a location opposed to said transducers.

9. A surface acoustic wave element according to claim 7 further including a highly concentrated impurity diffused region provided in a surface of said Si substrate in a location opposed to said transducers.

10. A surface acoustic wave element according to claim 7, wherein said Si substrate is a low resistant single crystalline substrate.

11. A surface acoustic wave element according to claim 7, wherein said Si substrate has a cut surface equivalent to (100), and said GaAs film is an epitaxial film grown on said surface equivalent to (100).

12. A surface acoustic wave element according to claim 11, wherein said surface acoustic wave propagates in a direction substantially in parallel to the Si<110> and GaAs<110> direction.

13. A surface acoustic wave element according to claim 7, wherein said ZnO film includes first and second portions which are provided at spaced locations on said GaAs piezoelectric semiconductor film and which each have thereon one of said transducers, and wherein a portion of said GaAs piezoelectric semiconductor film is free of said ZnO film in a region between said first and second portions of said ZnO film.

14. A surface acoustic wave element comprising: a Si substrate; a GaAs piezoelectric semiconductor film provided on said Si substrate; a unidirectional transducer provided on said GaAs piezoelectric semiconductor film to generate a surface acoustic wave; an $Al_xGa_{1-x}As$ layer provided on said GaAs piezoelectric semiconductor film, a GaAs transfer channel layer provided on said $Al_xGa_{1-x}As$ layer, an $Al_xGa_{1-x}As$ charge supply layer provided on said GaAs transfer channel layer; a GaAs cap layer provided on said $Al_xGa_{1-x}As$ charge supply layer; an input diode including an ohmic electrode and a Schottky electrode both provided on said GaAs cap layer; a non-destructive sensing tap Schottky electrode provided on said GaAs cap layer; and an ohmic electrode provided on said GaAs cap layer; said GaAs piezoelectric semiconductor film having a thickness H which satisfies kH≧0.8, where said surface acoustic wave is a Sezawa wave having a wavelength λ, and k=2π/λ.

15. A surface acoustic wave element according to claim 14, wherein said surface acoustic wave propagates in a direction substantially in parallel to the Si<110> and GaAs<110> direction.

16. A surface acoustic wave element according to claim 14, wherein said Si substrate is a low resistant single crystalline substrate.

17. A surface acoustic wave element according to claim 14, wherein said Si substrate has a cut surface equivalent to (100), and said GaAs film is an epitaxial film grown on said surface equivalent to (100).

18. A surface acoustic wave element according to claim 14, wherein said $Al_xGa_{1-x}As$ layer on said piezoelectric semiconductor film, said transfer channel layer, said charge supply layer and said cap layer have a combined thickness in the range of 2000–3000 Å.

19. A surface acoustic wave element according to claim 14, wherein said non-destructive sensing tap Schottky electrode includes a plurality of electrode elements provided at spaced locations on said cap layer, and including a plurality of multipliers each having a first input coupled to a respective one of said electrode elements and a second input to which is applied a respective weighting factor, said multipliers having outputs which are connected to each other, and each said multiplier being a dual gate GaAs FET.

20. A surface acoustic wave element according to claim 14, wherein said unidirectional transducer includes a comb-shaped Schottky electrode and a SAW grating reflector disposed on a side of said comb-shaped Schottky electrode remote from said ohmic electrode.

* * * * *